United States Patent
Kouyama (10) Patent No.: US 6,643,497 B1
(45) Date of Patent: Nov. 4, 2003

(54) PORTABLE TELEPHONE COMPENSABLE FOR CHANGE OF ANTENNA IMPEDANCE

(75) Inventor: Naoyuki Kouyama, Saitama (JP)

(73) Assignee: NEC Corporation, Tokyo (JP)

( * ) Notice: Subject to any disclaimer, the term of this patent is extended or adjusted under 35 U.S.C. 154(b) by 364 days.

(21) Appl. No.: 09/656,750

(22) Filed: Sep. 7, 2000

(30) Foreign Application Priority Data

Sep. 7, 1999 (JP) .......................................... 11-252614

(51) Int. Cl.[7] ................................................ H04B 1/44
(52) U.S. Cl. ............................ 455/83; 455/78; 343/850
(58) Field of Search ............................. 455/69, 82, 83, 455/78, 126, 127, 128, 90; 333/101; 343/850

(56) References Cited

U.S. PATENT DOCUMENTS

| | | |
|---|---|---|
| 5,129,098 A | 7/1992 | McGirr et al. |
| 5,335,368 A | 8/1994 | Tamura |
| 6,115,585 A * | 9/2000 | Matero et al. ................. 455/78 |
| 6,332,071 B1 * | 12/2001 | Brandt .......................... 455/82 |

FOREIGN PATENT DOCUMENTS

| | | |
|---|---|---|
| CN | 1159105 A | 9/1997 |
| EP | 0518526 A1 | 5/1992 |
| GB | 2213998 A | 5/1989 |
| GB | 2271218 A | 4/1994 |
| GB | 2293727 A | 4/1996 |
| GB | 2308744 A | 7/1997 |
| JP | 57-60739 | 12/1982 |
| JP | 5-110454 | 4/1993 |
| JP | 5-113216 | 5/1993 |
| JP | 9-116457 | 5/1997 |
| JP | 11-68611 | 3/1999 |
| JP | 11-136157 | 5/1999 |
| JP | 11-145852 | 5/1999 |

OTHER PUBLICATIONS

Chinese Office Action dated Aug. 30, 2002, with translation.

* cited by examiner

Primary Examiner—William Trost
Assistant Examiner—Andrew T Harry
(74) Attorney, Agent, or Firm—McGinn & Gibb, PLLC (57) ABSTRACT

A portable telephone is provided, which eliminates or effectively suppresses the change of the antenna impedance due to approach or contact of a human body with the telephone. The telephone operates without using sensing detection devices for recognizing the actual approach or contact of a human body with the phone. The device insures the desired antenna characteristics with a simple and low-cost configuration. Different impedance values of an impedance matching subsystem are switched so as to be interlocked with a start and stop of a talking state of the portable telephone.

20 Claims, 8 Drawing Sheets

PORTABLE TELEPHONE COMPENSABLE FOR CHANGE OF ANTENNA IMPEDANCE

BACKGROUND OF THE INVENTION

1. Field of the Invention

The present invention relates to a portable telephone that eliminates the deterioration of speech quality due to the influence of a human body and more particularly, to a portable telephone that suppresses effectively or cancels the change of antenna impedance caused by approach or contact of a human body to the telephone without any measure for recognizing the approach and/or contact of the body.

2. Description of the Related Art

With radio communications devices or radio transceivers such as portable telephones, to match the output impedance value of the transmission circuit with the impedance value of the antenna and to match the input impedance value of the reception circuit with the impedance value of the antenna, various impedance matching circuits having different configurations have been used. The technique that several matching circuits with different impedance values are provided in advance and one of them is selectively used according to a specific condition has been well known.

For example, the Japanese Examined Patent Publication No. 58-51453, published on Nov. 16, 1983, discloses a "transmission device" configured in such a way that the impedance value is selected so as to maximize the power efficiency according to the transmitted output. Also, the Japanese Non-Examined Patent Publication No. 5-110454, published on Apr. 30, 1993, discloses a "radio communications apparatus", in which several matching circuits having different impedance values are provided in advance and one of the matching circuits is selectively used by way of a switch according to the transmitted output.

In recent years, several techniques have been developed to accomplish the impedance matching in the radio communications devices or radio transceivers of this sort while taking the influence of a human body into consideration. These techniques have the intention to cancel or suppress the influence of a human body that the approach or contact of the body to the device or transceiver induces some change of the antenna impedance value, thereby deviating the antenna characteristic from its desired one.

For example, the Japanese Non-Examined Patent Publication No. 5-113216, published on May 7, 1993, discloses a "wireless remote-control device" configured in such a way that a second impedance matching circuit having a different impedance value from a first impedance matching circuit is used instead of the first impedance matching circuit within a specific time period after some kind of control operation is performed by the user or until the transmission or reception operation is finished. The impedance value is changed temporarily only when the user controls the remote-control device, because the device is affected by a human body only at that time. The remote-control device has an advantage that the means or measure for detecting and/or recognizing the body is unnecessary.

Recently, there has been the tendency that the antenna impedance value of portable telephones varies or fluctuates during the talking (i.e., calling or receiving) operation due to the influence of a human body (i.e., the user's body). This is because the distance between the user's temple and the antenna has been getting shorter according to the progress of miniaturization and weight reduction of portable telephones. Thus, impedance value mismatch tends to occur during the talking state, resulting in inconveniences such as talking or speech interception in low electrical field (weak radio wave) areas, or voice interruption during the talking state. To prevent such the deterioration of speech quality, various techniques have been developed.

For example, the Japanese Non-Examined Patent Publication No. 11-145852, published on May 28, 1999, discloses an "antenna circuit" having the following configuration. Specifically, the level of the transmission power from the antenna is detected while the level of the transmission power from the transmitter is kept constant. One of impedance matching circuits is selectively used so as to maximize the level thus detected of the transmission power from the antenna. This antenna circuit has an advantage that even if the impedance value of the antenna is changed due to the influence of a human body, an obtainable antenna gain is stable, thereby improving the speech quality.

The Japanese Non-Examined Patent Publication No. 11-136157, published on May 21, 1999, discloses a "mobile radio terminal device" capable of high-quality communication. This mobile radio terminal device comprises at least one impedance matching correction circuit and a human body recognizer for recognizing the contact of a human body, in addition to impedance matching circuits. The human body recognizer recognizes whether or not a human body is contacted with the device by way of a recognition signal outputted from the recognizer. If a human body is contacted with the device, the reception signal is transmitted to the at least one impedance matching correction circuit and one of the impedance matching circuits according to the level of the reception signal.

The wireless remote-control device disclosed in the Publication No. 5-113216 has an advantage that no measure for detecting the contact of a human body is necessary and therefore, the configuration of the device can be simplified. However, the configuration that the second impedance matching circuit is used instead of the first impedance matching circuit within a specific time period after some kind of control operation is performed by the user or until the transmission or reception operation is finished is applicable only to the wireless remote-control device. Thus, this configuration cannot be applied to portable telephones.

The antenna circuit disclosed in the Publication No. 11-145852 necessitates a circuit for detecting the level of the transmission power from the antenna while the level of the transmission power from the transmitter is kept constant, and a circuit for switching the impedance matching circuits in order to maximize the level of the transmission power from the antenna. Thus, the antenna circuit has a problem that the circuit configuration is complicated and the fabrication cost is raised.

The mobile radio terminal device disclosed in the Publication No. 11-136157 necessitates the human body recognizer for recognizing the contact of a human body and a circuit for selectively transmitting the reception signal to the at least one impedance matching correction circuit and one of the impedance matching circuits after measuring the level of the reception signal. Therefore, the mobile radio terminal device has a problem that the device configuration is complicated and the fabrication cost is increased.

SUMMARY OF THE INVENTION

Accordingly, an object of the present invention is to provide a portable telephone that eliminates or suppress effectively the change of the antenna impedance due to approach or contact of a human body without any special measure for recognizing the approach or contact of a human body.

Another object of the present invention is to provide a portable telephone that ensures a desired antenna characteristic with a simple and low-cost configuration.

The above objects together with others not specifically mentioned will become clear to those skilled in the art from the following description.

A portable telephone according to the present invention is comprised of;

(a) an antenna;

(b) a radio section for processing a radio-frequency reception signal received by the antenna and for processing a radio-frequency transmission signal to be transmitted and sending the radio-frequency transmission signal thus processed to the antenna;

(c) a control section for controlling the radio section; and (d) an impedance matching subsystem for matching an impedance of the antenna with an impedance of the radio section;

the impedance matching subsystem being designed to have different impedance values;

the different impedance values of the impedance matching subsystem being switched so as to be interlocked with start and stop of a talking state of the telephone.

With the portable telephone according to the present invention, the different impedance values of the impedance matching subsystem are switched so as to be interlocked with start and stop of a talking state of the telephone. In the talking state, a user of the telephone according to the invention places the telephone itself in the vicinity of his/her ear and therefore, the antenna of the telephone is located near the user's temple or contacted therewith. On the other hand, in the states other than the talking state (e.g., the stand-by state or data communication state), the antenna of the telephone is located apart from the user's temple. Accordingly, whether or not the antenna of the telephone is located near the user's temple or contacted therewith can be noticed whether or not the telephone is in the talking state.

As a consequence, by switching the different impedance values of the impedance matching subsystem so as to be interlocked with the start and stop of the talking state, the antenna impedance value can be changed according to whether or not the antenna is in the state where the antenna is located near or contacted with the user's temple. Thus, the telephone according to the invention is able to eliminate or suppress effectively the change of the antenna impedance due to the approach or contact of a human body without any special measure for recognizing the approach or contact of a human body.

Also, since any special measure for recognizing the approach or contact of a human body is unnecessary, a desired antenna characteristic can be ensured with a simple and low-cost configuration.

In a preferred embodiment of the telephone according to the invention, the control section comprises a reception signal processing circuit. The reception signal processing circuit includes an audio-frequency signal amplifier circuit for amplifying an audio-frequency signal generated by demodulating the radio-frequency reception signal. The start and stop of the talking state is detected by detecting start and stop of operation of the audio-frequency signal amplifier circuit, thereby switching the different impedance values of the impedance matching subsystem.

The audio-frequency signal amplifier circuit enters its operating state if the radio-frequency reception signal contains audio or speech information, in other words, if the telephone is placed near the user's ear (i.e., the telephone is located near the temple of the user or contacted therewith). On the other hand, the audio-frequency signal amplifier circuit stops its operation if the radio-frequency reception signal contains no audio or speech information, in other words, if the telephone is located apart from the temple of the user. Accordingly, whether or not the antenna of the telephone is located near the User's temple or contacted therewith can be noticed by way of detecting whether or not the audio-frequency signal amplifier circuit is in the operation state.

As a result, by switching the different impedance values of the impedance matching subsystem so as to be interlocked with the start and stop of operation of the audio-frequency signal amplifier circuit, the antenna impedance value can be changed according to whether or not the antenna is in the talking state where the antenna is located near or contacted with the user's temple. Thus, in the above-described preferred embodiment of the invention, the telephone is able to eliminate or suppress effectively the change of the antenna impedance value due to approach or contact of a human body without any special measure for recognizing the approach or contact of a human body.

In the above-described preferred embodiment, it is preferred that the start and stop of operation of the audio-frequency signal amplifier circuit is carried out by way of a switch that controls supply of electric power to the audio-frequency signal amplifier circuit. In this case, there is an additional advantage that the start and stop of operation of the audio-frequency signal amplifier circuit can be recognized with a simple configuration.

In another preferred embodiment of the telephone according to the invention, the impedance matching subsystem comprises impedance matching circuits having the different impedance values. The different impedance values of the impedance matching circuits are switched by selecting one of the impedance matching circuits. In this embodiment, there is an additional advantage that the impedance matching circuits can be designed to have the same configuration that produces the different impedance values.

Alternately, the impedance matching subsystem may comprise a single impedance matching circuit having the different impedance values. The different impedance values of the single impedance matching circuit are switched by selecting one of the impedance values of the single impedance matching circuit. In this embodiment, there is an additional advantage that the circuit scale of the impedance matching subsystem can be smaller than the case where the impedance matching subsystem comprises a plurality of impedance matching circuits.

In still another preferred embodiment of the telephone according to the invention, a first one of the different impedance values of the impedance matching subsystem is set at a value that optimizes impedance matching between the antenna and the radio section without taking an influence of a human body into consideration, and the first one of the different impedance values is selected when the telephone is not in the talking state. Moreover, a second one of the different impedance values of the impedance matching subsystem is set at a value that optimizes impedance matching between the antenna and the radio section with taking an influence of a human body into consideration, and the second one of the different impedance values is selected when the telephone is in the talking state. In this embodiment, there is an additional advantage that the influence of a human body to the antenna can be eliminated approximately completely.

In a further preferred embodiment of the telephone according to the invention, a return loss of the antenna seen from the radio section is minimized (i.e., the magnitude of a return loss of the antenna seen from the radio section is maximized) at a first frequency when the telephone is in the talking state and at a second frequency when the telephone is not in the talking state. The first frequency is higher than the second frequency. In this embodiment, there is an additional advantage that the advantages of the invention can be more conspicuous.

In this embodiment, it is preferred that the first frequency is changed to a frequency equal to or near the second frequency due to the influence of a human body. In this case, there is an additional advantage that the influence of a human body to the antenna can be eliminated approximately completely.

In a still further preferred embodiment of the telephone according to the invention, at least one additional antenna is further provided for diversity reception. The different impedance values of the impedance matching subsystem are switched for each of the antenna and the at least one additional antenna. In this case, there is an additional advantage that the influence of a human body to these antennas can be eliminated or effectively suppressed in the diversity reception.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

FIRST EMBODIMENT

Figure 2:
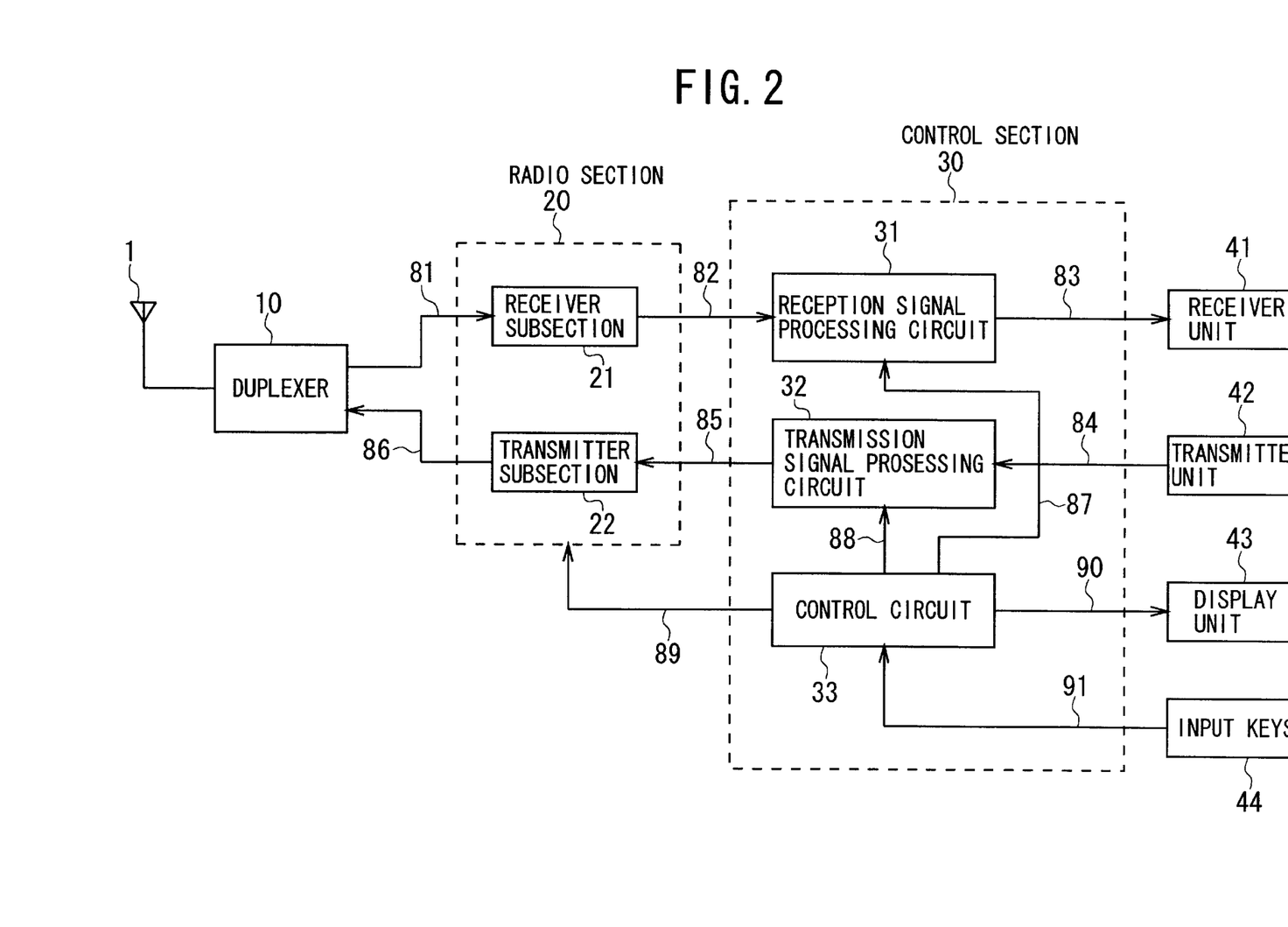
FIG. 2 is a functional block diagram showing the whole configuration of the portable telephone according to the first embodiment of FIG. 1.

The whole configuration of a portable telephone according to a first embodiment of the present invention is shown in FIG. 2. This configuration itself resembles to that of well-known popular portable telephones.

In FIG. 2, an antenna duplexer 10 is provided to enable the common use of an antenna 1 in the transmission and reception operations. The duplexer 10 usually includes an impedance matching circuit (not shown) for matching the impedance between the antenna 1 and a radio section 20, and a filter or filters (not shown) that enable(s) the common use of the antenna 1 in the transmission and reception operations.

The radio section 20 comprises a receiver subsection 21 and a transmitter subsection 22. The receiver subsection 21 receives a Radio-Frequency (RF) reception signal 81 which has been received by the antenna 1 and outputted from the duplexer 10. Then, the receiver subsection 21 amplifies and demodulates the RF reception signal 81 to generate a baseband signal 82. The subsection 21 outputs the signal 82 thus generated to a control section 30.

The transmitter subsection 22 amplifies and modulates a baseband signal 85 which has been outputted from the control section 30, generating a RF transmission signal 86. The section 22 outputs the signal 86 thus generated to the duplexer 10.

The control subsection 30 is comprised of a reception signal processing circuit 31, a transmission signal processing circuit 32, and a control circuit 33.

The reception signal processing circuit 31 receives the baseband signal 82 transmitted from the receiver subsection 21 of the radio section 20, deals with the signal 82 according to the specific processes, and outputs an Audio-Frequency (AF) signal 83 corresponding to the RF reception signal 81 to a receiver unit 41. As a result, an audible sound corresponding to the transmitted audio information is emitted from the receiver unit 41.

The transmission signal processing circuit 32 receives an AF signal 84 transmitted from a transmitter unit 42 and deals with the signal 84 according to the specific processes, generating the baseband signal 85 corresponding to the AF signal 84. Then, the circuit 32 transmits the baseband signal 85 thus generated to the transmitter subsection 22 of the radio section 20. The transmitter subsection 22 modulates and amplifies the baseband signal 85 thus transmitted to generate the RF transmission signal 86 and then, transmits the signal 86 to the antenna 1.

The control circuit 33 transmits a display signal 90 including specific information to a display unit 43 to display the information on the unit 43, thereby indicating the information in the signal 90 to the user of the telephone. The user may control input keys 44 according to the necessity, thereby inputting desired telephone numbers and/or various information such as various configuration or setting data into the portable telephone itself. The information thus inputted is transmitted to the control circuit 33 as an input signal 91.

Also, the control circuit 33 controls the reception signal processing circuit 31, the transmission signal processing circuit 32, and the radio section 20 by way of control signals 87, 88, and 89, respectively. The circuit 33 controls the circuits 31 and 32 and the section 20 in the known way and therefore, the explanation about it is omitted here.

Figure 1:
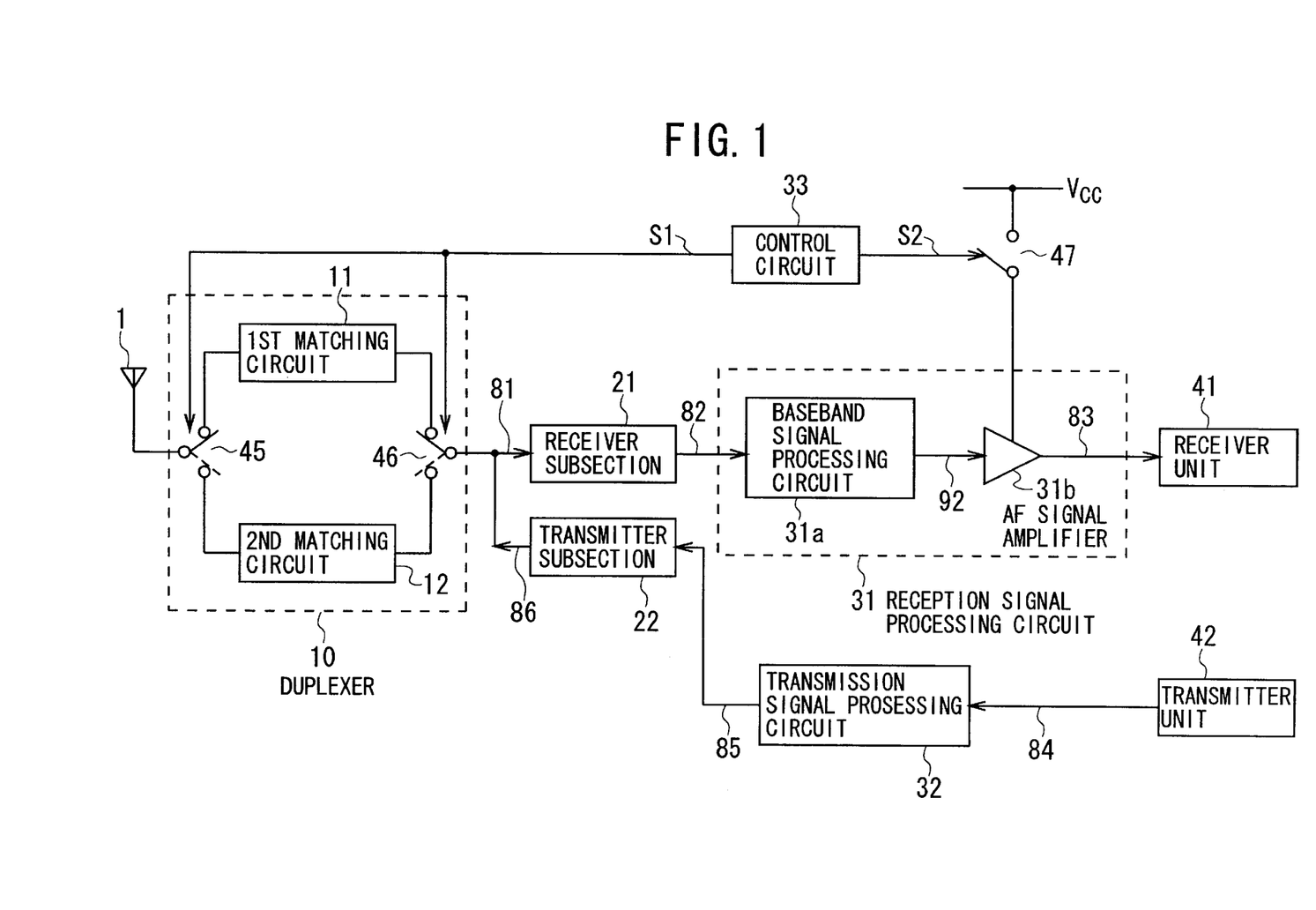
FIG. 1 is a functional block diagram showing the detailed configuration of a portable telephone according to a first embodiment of the present invention.

FIG. 1 shows the detailed configuration of the above-described portable telephone according to the first embodiment with reference to FIG. 2.

As shown in FIG. 1, the antenna duplexer 10 has first and second impedance matching circuits 11 and 12 and two switches 45 and 46 for switching the circuits 11 and 12. The switches 45 and 46 are simultaneously driven by a control signal S1 sent from the control circuit 33 of the control section 30, thereby selectively connecting one of the circuits 11 and 12 to the antenna 1 and the radio section 20 (i.e., the receiver subsection 21 and the transmitter subsection 22).

The first and second impedance matching circuits 11 and 12 have different impedance values from each other. Specifically, the impedance value of the first impedance matching circuit 11 is defined to match the impedance value of the antenna 1 with that of the radio section 20 when the antenna 1 is not placed near a human body (i.e., the user of the telephone) and it is not contacted therewith. The impedance value of the second impedance matching circuit 12 is defined to match the impedance value of the antenna 1 with that of the radio section 20 when the antenna 1 is placed near a human body or it is contacted with a human body.

The reception signal processing circuit 31 of the control section 30 is comprised of a baseband signal processing circuit 31a and an AF signal amplifier circuit 31b. The baseband signal processing circuit 31a receives the baseband reception signal 82 sent from the receiver subsection 21 and deals with the signal 82 according to the specific processes, thereby generating an AF signal 92. The specific processes include, for example, a digital-analog (D-A) conversion process, a bandwidth compression and/or expansion process, and so forth. The AF signal amplifier circuit 31b amplifies the AF signal 92 thus generated to produce an AF signal 83 for driving the receiver unit 41. On receipt of the AF signal 83, the receiver unit 41 emits specific audible sound corresponding to the audio information included in the RF reception signal 81.

The AF signal amplifier circuit 31b is usually designed to operate (or, to be activated) only when the portable telephone is in its talking or speech state, in other words, when the RF reception signal 81 includes audio information. In the telephone according to the first embodiment, the AF signal amplifier 31b is designed to be supplied with a power-supply voltage $V_{CC}$ through a Switch 47. The switch 47 is turned on or off by way of a control signal S2 sent from the control circuit 33.

When the RF reception signal 81 includes audio information (i.e., the telephone is in the talking state), the switch 47 is turned on by way of the control signal S2, thereby supplying the power-supply voltage $V_{CC}$ to the AF signal amplifier circuit 31b. Thus, the circuit 31b is activated or operable. On the other hand, when the RF reception signal 81 does not include audio information (i.e., the telephone is not in the talking state), the switch 47 is turned off by way of the control signal S2, thereby stopping the supply of the power-supply voltage $V_{CC}$ to the circuit 31b. Thus, the circuit 31b is inactivated or inoperable.

In addition, the reason why the AF signal amplifier circuit 31b is designed to operate only when the portable telephone is in its talking state is that the circuit 31b is unnecessary when the RF reception signal 81 includes no audio information (for example, when the signal 81 includes only digital data such as E-mail messages). This is to suppress the power consumption of the telephone itself as much as possible by stopping the operation of the circuit 31b if the circuit 31b is unnecessary.

Accordingly, the fact that the AF signal amplifier 31b is activated means that the RF reception signal 81 includes audio information. Furthermore, this fact means that the user is holding the receiver unit 41 to be contacted with his/her ear, in other words, the antenna 1 is placed near the user's temple or is contacted therewith. Similarly, the fact that AF signal amplifier 31b is inactivated means that the RF reception signal 81 includes no audio information and that the antenna 1 is apart from the user's temple. In summary, whether or not the portable telephone according to the first embodiment is in the talking state, in other words, whether or not the antenna 1 is placed near or contacted with the user's temple can be recognized by detecting the activation/inactivation of the AF signal amplifier circuit 31b or the supply/stop of the power-supply voltage $V_{cc}$ to the circuit 31b. Taking these conditions into consideration, in the portable telephone according to the first embodiment of FIG. 1, the switches 45 and 46 of the antenna duplexer 10 can be turned on or off in synchronization with the turning on or off of the switch 47 for controlling the supply of the power-supply voltage $V_{cc}$ to the circuit 31b.

When the switch 47 is turned off, the switches 45 and 46 have the connection states shown by solid lines in FIG. 1. The off state of the switch 47 means that the antenna 1 is not placed near the user's temple and therefore, the first impedance matching circuit 11 having an optimum impedance value defined without considering the influence of a human body (i.e., the user's body) is connected between the antenna 1 and the radio section 20.

When the switch 47 is turned on, the switches 45 and 46 are driven to have the connection states shown by broken lines in FIG. 1. The on state of the switch 47 means that the antenna 1 is placed near the user's temple and therefore, the second impedance matching circuit 12 having an optimum impedance value defined with considering the influence of a human body (i.e., the user's body) is connected between the antenna 1 and the radio section 20.

As explained above in detail, the change of the impedance value of the antenna 1 due to approach or contact of a human body (i.e., the user's temple) can be eliminated or effectively suppressed without providing any special measure for recognizing the approach or contact of a human body. As a result, a desired antenna characteristic can be ensured with a simple and low-cost configuration.

Figure 3:
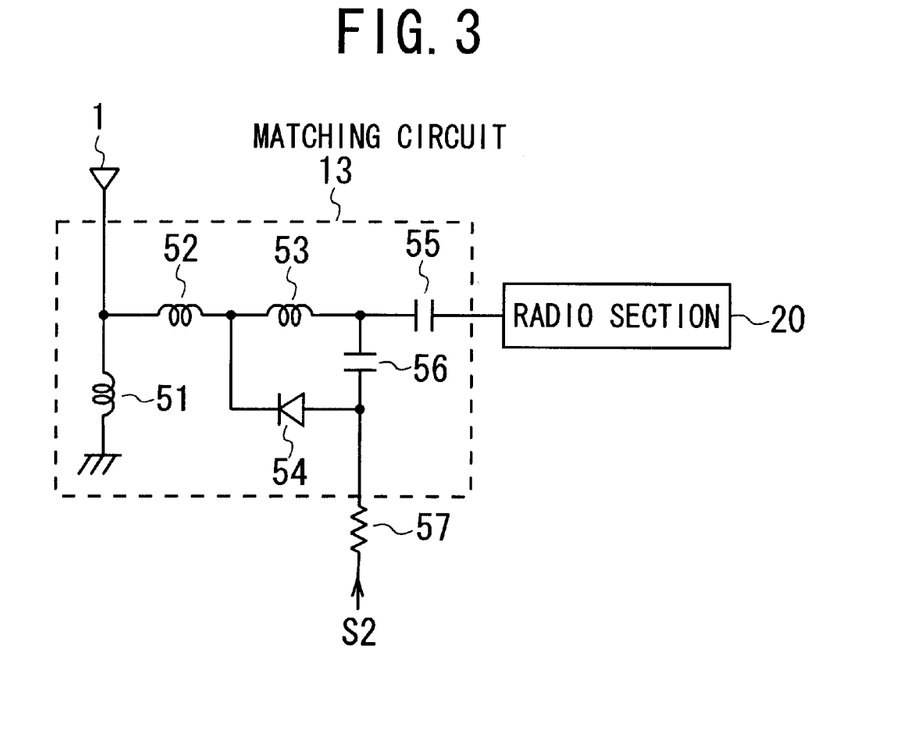
FIG. 3 is a circuit diagram of the impedance matching circuit applicable to the portable telephone according to the first embodiment of FIG. 1, which can be switched between two different impedance values by a control signal.

FIG. 3 shows an example of the configuration of the impedance matching circuit capable of switching two impedance values by the control signal S2. This configuration includes the first and the second impedance matching circuits 11, 12 and the switches 45 and 46 shown in FIG. 1.

The impedance matching circuit 13 shown in FIG. 3 is comprised of three coils 51, 52, and 53, two capacitors 55 and 56, and one PIN diode 54. The coil 51 is connected to the antenna 1 and the ground terminal. The coils 52 and 53 and the capacitor 55, which are serially connected to each other, are connected to the antenna 1 and the radio section 20. The capacitor 56 and the diode 54, which are serially connected to each other, are connected to the connection point of the coils 52 and 53 and the connection point of the coil 53 and the capacitor 55. In other words, the capacitor 56 and the diode 54 are connected in parallel to the coil 53.

The control signal S2 is inputted into the connection point of the diode 54 and the capacitor 56 through a resistor 57 for current limitation. The control signal S2 is a binary signal having a high (H) or low (L) voltage level.

Figure 4A:
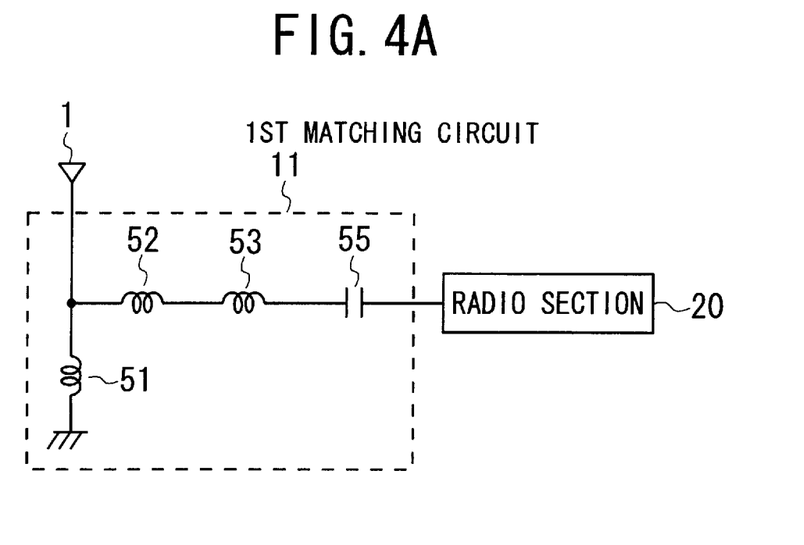
FIG. 4A is a circuit diagram showing the equivalent configuration of the impedance matching circuit of FIG. 3, in which the control signal S2 is at the low level.
Figure 4B:
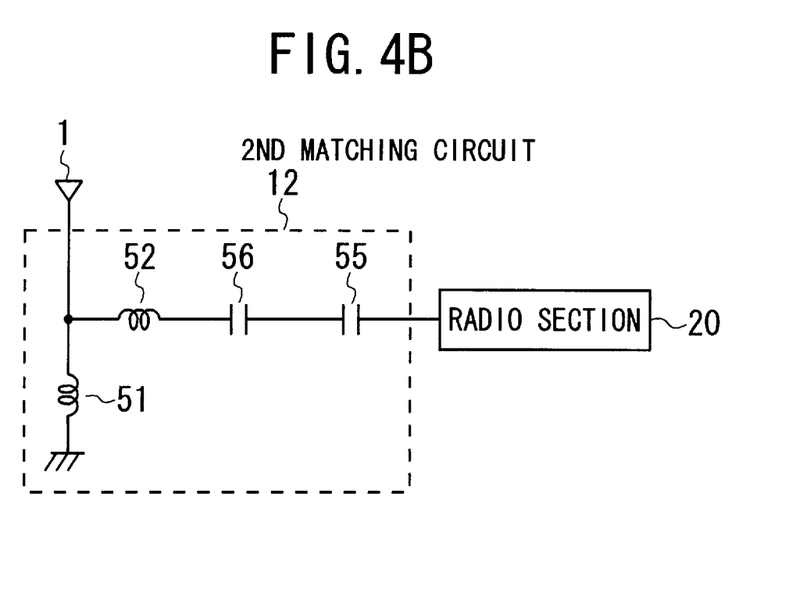
FIG. 4B is a circuit diagram showing the equivalent configuration of the impedance matching circuit of FIG. 3, in which the control signal S2 is at the high level.

When the control signal S2 is at the low (L) level, the impedance matching circuit 13 is equivalent to the circuit configuration shown in FIG. 4(*a*). This is because the diode 54 is turned off and as a result, the capacitor 56 is inactive. The configuration of FIG. 4(*a*) can be used as the first impedance matching circuit shown in FIG. 1. On the other hand, when the control signal S2 is at the high (H) level, the impedance matching circuit 13 is equivalent to the circuit configuration shown in FIG. 4(*b*). This is because the diode 54 is turned on and as a result, the coil 53 is inactive instead of the capacitor 56. The configuration shown in FIG. 4(*b*) can be used as the second impedance matching circuit 12 shown in FIG. 1.

The average current consumption in the stand-by state of ordinary portable telephones is approximately 1 mA. To turn on the PIN diode 54, a current of at least approximately 3 mA is usually necessary and therefore, the diode 54 is automatically kept off in the stand-by state. Thus, the configuration of the impedance matching circuit 13 shown in FIG. 3 has an advantage that the average current consumption in the stand-by state does not increase even if the diode 54 is additionally provided.

Figure 5:
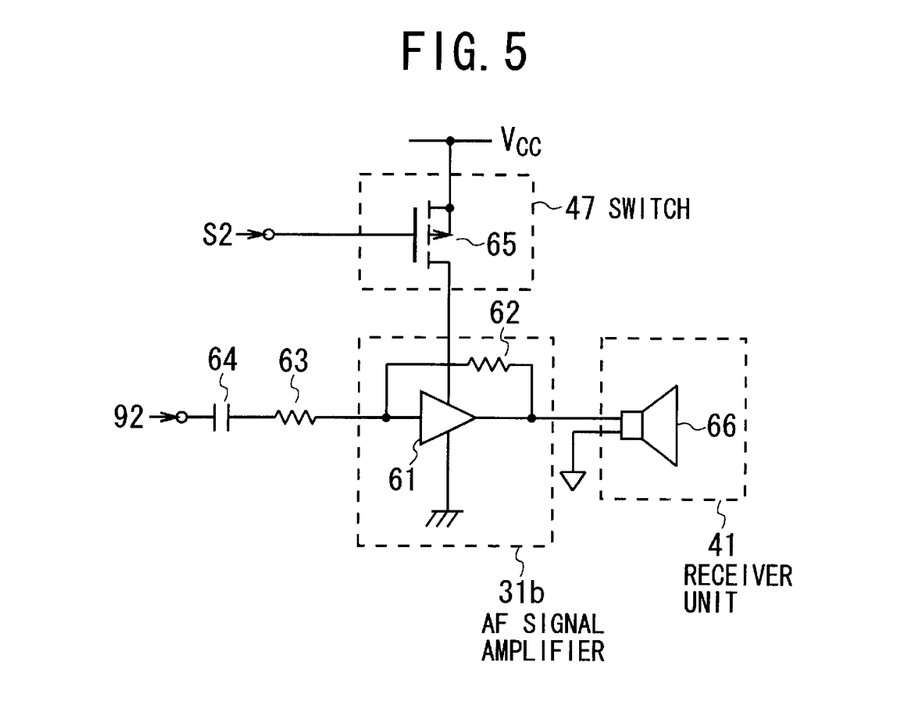
FIG. 5 is an example of the configuration of the audio-frequency signal amplifier circuit and the switch that controls the supply of the power supply voltage to the audio-frequency signal amplifier circuit.

FIG. 5 shows an example of the circuit configuration of the switch 47 and the AF signal amplifier circuit 31*b* shown in FIG. 1. In FIG. 5, the switch 47 is constituted by an n-channel enhancement-type Field-Effect Transistor (FET) 65, and the control signal S2 is applied to the gate of the FET 65.

The AF signal amplifier circuit 31*b* has an operational amplifier 61 and a feedback resistor 62. The power-supply voltage $V_{CC}$ is supplied to the operational amplifier 61 by way of the FET 65. The output terminal of the circuit 31*b* is connected to the speaker 66 of the receiver unit 41. The output terminal of the circuit 31*b* is further connected to the baseband signal processing circuit 31*a* by way of a coupling resistor 63 and a coupling capacitor 64. The drain of the FET 65 is connected to the power supply terminal of the operational amplifier 61, and the source of the FET 65 is connected to the power supply line to which the power supply voltage $V_{CC}$ is applied.

The AF signal 92 outputted from the baseband signal processing circuit 31*a* is inputted into the input terminal of the AF signal amplifier circuit 31*b* by way of the coupling resistor 63 and the coupling capacitor 64.

When the control signal S2 is at the L level, the FET 65 is in the off state and therefore, the supply of the power supply voltage $V_{CC}$ to the operational amplifier 61 is stopped. At this time, since the RF reception signal 81 includes no audio signal (which means that the portable telephone is not in the talking state), the first impedance matching circuit 11 shown in FIG. 1 is used or activated. On the other hand, when the control signal S2 is at the H level, the transistor 65 is in the on state. Thus, the power supply voltage $V_{cc}$ is supplied to the operational amplifier 61, activating the amplifier 61. At this time, the RF reception signal 81 includes an audio signal (which means that the portable telephone is in the talking state) and thus, the impedance value of the antenna 1 is changed from its original value due to the influence of a human body (i.e., the user's temple). To compensate this impedance change of the antenna 1, the second impedance matching circuit 12 shown in FIG. 1 is used or activated instead of the first impedance matching circuit 11.

Figure 7:
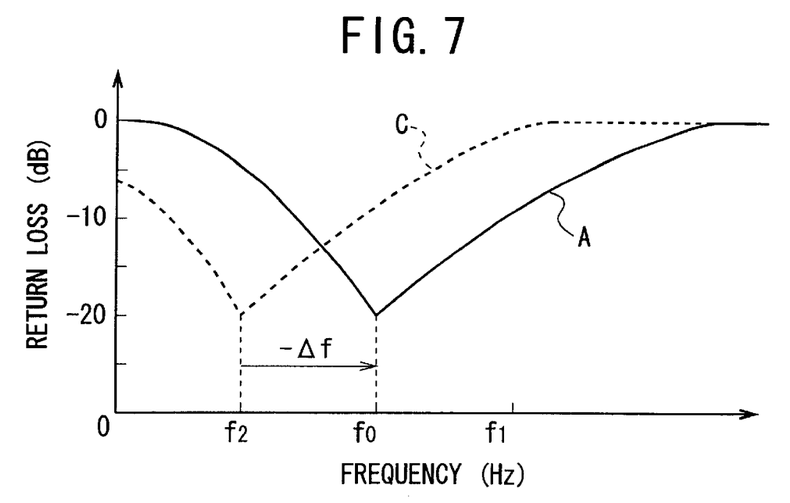
FIG. 7 is a graph showing the frequency characteristic of the return loss of the antenna seen from the radio section of the impedance matching circuit of FIG. 3 when the second impedance matching circuit is removed from the antenna duplexer in the portable telephone according to the first embodiment of FIG. 1.

FIG. 7 shows the frequency characteristic of the return loss of the antenna 1 seen from the radio section 20. The "return loss (dB)" represents the degree or level of impedance matching. It is preferred that the value of the return loss is as low as possible, in other words, the absolute value or magnitude of the return loss is as large as possible. This is because if the return loss (dB) is high in value (i.e., the magnitude of the return loss is small), the signal reflection by the antenna 1 is little, which enables efficient signal transmission.

The curve A drawn by the solid line in FIG. 7 shows the change of the return loss when the antenna 1 is not affected by a human body, in which the return loss has the minimum value at the frequency $f_0$. The curve C drawn by the broken line in FIG. 7 shows the change of the return loss when the antenna 1 is affected by a human body, in which the return loss has the minimum value at the frequency $f_2$ lower than the frequency $f_0$ by $\Delta f$ (i.e., $f_2 = f_0 - \Delta f$). In other words, if only the first impedance matching circuit 11 is used, the frequency $f_0$ that minimizes the return loss is shifted toward the lower-frequency region due to the influence of a human body, resulting in the frequency $f_2$ ($f_2 < f_0$). This means that the impedance matching is not accomplished, which deviates the characteristic of the antenna 1 from its desired one and degrades the speech quality of the telephone.

Figure 6:
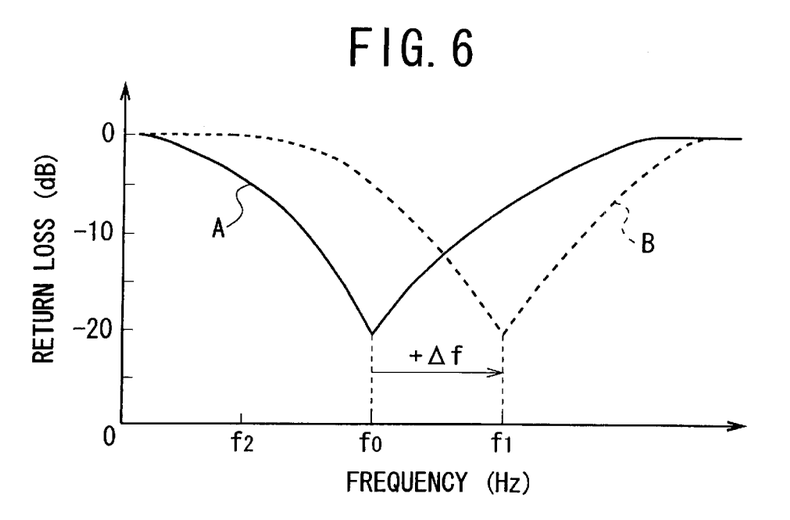
FIG. 6 is a graph showing the frequency characteristic of the return loss of the antenna seen from the radio section of the impedance matching circuit of FIG. 3 in the portable telephone according to the first embodiment of FIG. 1.

FIG. 6 shows the frequency characteristic of the return loss of the antenna 1 seen from the radio section 20 of the portable telephone according to the first embodiment.

The curve A drawn by the solid line in FIG. 6 shows the change of the return loss when the antenna 1 is not affected by a human body and the first impedance matching circuit 11 is used, which is the same as shown in FIG. 7. The curve B drawn by the broken line in FIG. 6 shows the change of the return loss when the antenna 1 is not affected by a human body and the second impedance matching circuit 12 is used. As seen from the curve B, the minimum value of the return loss is given at the frequency $f_1$ higher than the frequency $f_0$ by $\Delta f$ (i.e., $f_1 = f_0 + \Delta f$). This means that the frequency that gives the minimum return loss is shifted toward the higher frequency region by $\Delta f$ by using the second impedance matching circuit 12 instead of the first impedance matching circuit 11, thereby causing deviation from the impedance matching condition intentionally.

As a result, if the frequency that minimizes the return loss is shifted toward to the lower frequency region by $\Delta f$ due to the influence of a human body in the talking state, as shown by the curve C in FIG. 7, the curve B in FIG. 6 is approximately entirely overlapped with the curve A. Accordingly, the impedance change of the antenna 1 caused by the influence of a human body is compensated, thereby matching the impedance even in the talking state. Thus, the desired characteristic of the antenna 1 can be ensured with a simple and low-cost configuration independent of the existence and absence of the influence of a human body, preventing the speech quality from degrading.

SECOND EMBODIMENT

Figure 8:
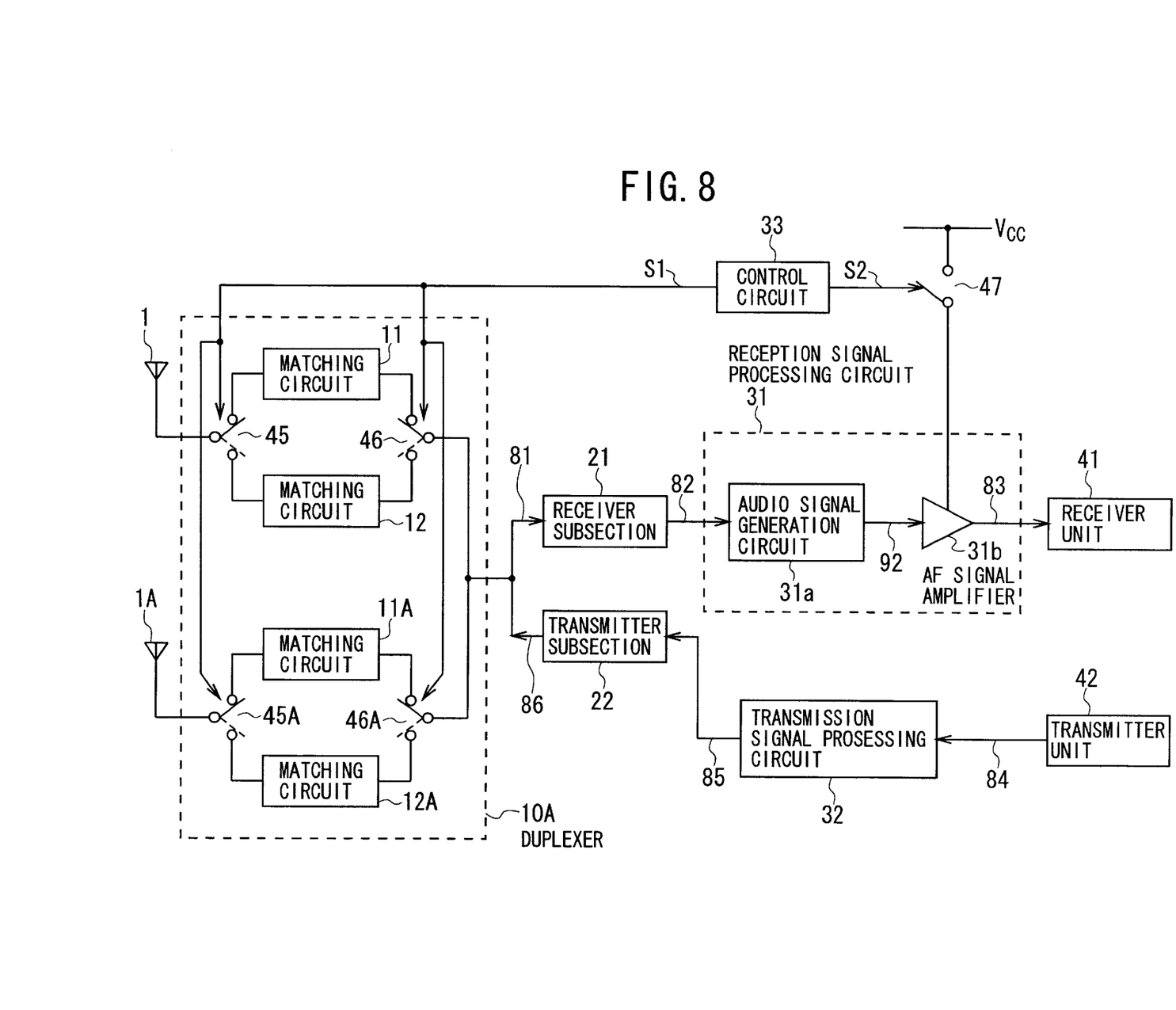
FIG. 8 is a functional block diagram showing the detailed configuration of a portable telephone according to a second embodiment of the present invention.

FIG. 8 shows the detailed configuration of a portable telephone according to a second embodiment of the present invention, which is similar to FIG. 1.

The portable telephone according to the second embodiment shown in FIG. 8 has the same configuration as the portable telephone according to the first embodiment of FIG. 1, except that an antenna 1A, third and fourth impedance matching circuits 11A and 12A, and two switches 45A and 46A are additionally provided to enable the diversity reception. Therefore, the explanation about the same configuration is omitted here for the sake of simplification by attaching the same reference symbols as used in the first embodiment to the same elements in FIG. 8.

As shown in FIG. 8, an antenna duplexer 10A, which is provided instead of the antenna duplexer 10 used in the first embodiment, comprises the third and fourth impedance matching circuits 11A and 12A and the switches 45A and 46A for switching the circuits 45A and 46A, in addition to the first and second impedance matching circuits 11 and 12 and the switches 45 and 46 for switching the circuits 11 and 12. The switches 45A and 46A are driven by the control signal S1 transmitted from the control circuit 33 of the control section 30 simultaneously with the switches 45 and 46. Thus, one of the third and fourth impedance matching circuits 11A and 12A is selectively connected to the antenna 1A and the radio section 20 (in other words, the receiver section 21 and the transmitter section 22).

The third and fourth impedance matching circuits 11A and 12A have different impedance values from each other. Specifically, the impedance value of the third impedance matching circuit 11A is defined so as to match the impedance values of the antenna 1A and the radio section 20 when the antenna 1A is not placed near a human body nor contacted therewith. The impedance value of the fourth impedance matching circuit 12A is defined so as to match the impedance values of the antenna 1A and the radio section 20 when the antenna 1A is placed near a human body or contacted therewith.

Thus, with the portable telephone capable of diversity reception according to the second embodiment of FIG. 8, since the impedance values for each of the two antennas 1 and 1A can be switched, the impedance change of the two antennas 1 and 1A caused by the influence of a human body is compensated, thereby matching the impedance of the antennas 1 and 1A even in the talking state. Thus, the desired characteristics of the antennas 1 and 1A can be ensured with a simple and low-cost configuration independent of the existence and absence of the influence of a human body, preventing the speech quality from degrading.

THIRD EMBODIMENT

Figure 9:
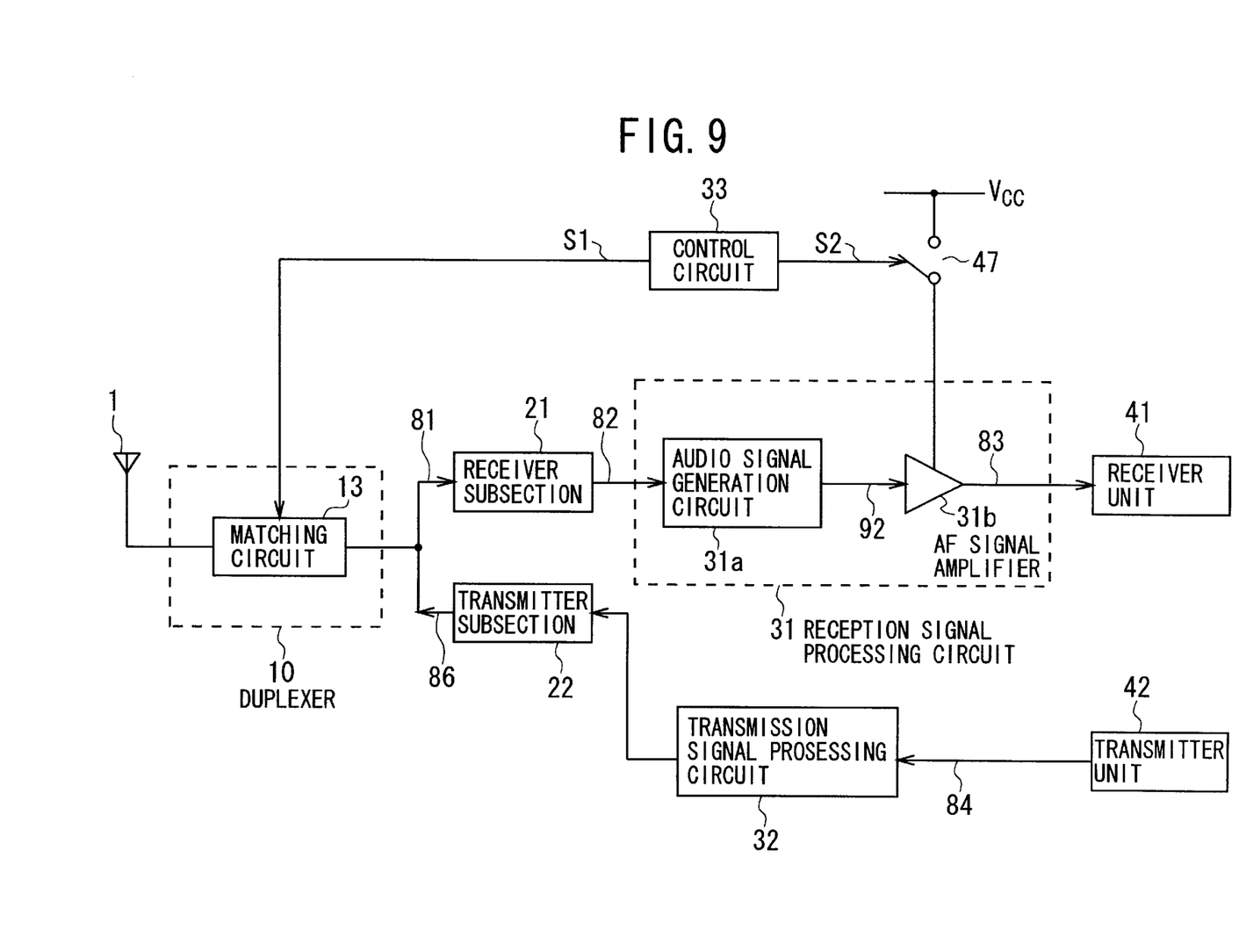
FIG. 9 is a functional block diagram showing the detailed configuration of a portable telephone according to a third embodiment of the present invention.

FIG. 9 shows the detailed configuration of a portable telephone according to a third embodiment of the present invention, which is similar to FIG. 1.

The portable telephone according to the third embodiment shown in FIG. 9 has the same configuration as the portable telephone according to the first embodiment shown of FIG. 1, except that only the impedance matching circuit 13 shown in FIG. 3 is provided instead of the combination of the first and second impedance matching circuits 11 and 12. Therefore, the explanation about the same configuration is omitted here for the sake of simplification by attaching the same reference symbols as used in the first embodiment to the same elements in FIG. 9.

As explained previously with reference to FIG. 3, the impedance matching circuit 13 has two different impedance values from each other corresponding to the respective impedance values of the first and second impedance matching circuits 11 and 12, in which the two impedance values can be switched by the control signal S1. Accordingly, the configuration shown in FIG. 9 is applicable to the present invention.

With the portable telephone according to the third embodiment, there is an additional advantage that the circuit scale of the impedance matching circuit is smaller than the first embodiment, in addition to the same advantages as those in the first embodiment.

VARIATION

In the above-described first, second, and third embodiments, the impedance values of the impedance matching circuit or circuits are changed in synchronization with the supply/stop of the power supply voltage VCC to the AF signal amplifier circuit 31b of the reception signal processing circuit 31. However, it is needless to say that the present invention is not limited thereto. Any method or configuration may be applied to the invention if it switches the different impedance values of the impedance matching circuit or circuits so as to be interlocked with the start and stop of the operation of the AF signal amplifier circuit 31b.

Moreover, the switching operation of the impedance values of the impedance matching circuit or circuits may be conducted by using any circuit or any signal other than the AF signal amplifier circuit 31b and the control signal S2. Any method or configuration may be applied to the invention if it switches the impedance values of the impedance matching circuit or circuits so as to be interlocked with the start and stop of the talking or speech state of the telephone.

In the above-described first to third embodiments, two different impedance values of the impedance matching circuit or circuits are switched. However, needless to say, three or more different impedance values of the impedance matching circuit or circuits may be switched as necessary.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A portable telephone comprising:
    an antenna;
    a radio section for processing a radio-frequency reception signal received by said antenna and for processing a radio-frequency transmission signal to be transmitted and sending said radio-frequency transmission signal thus processed to said antenna;
    a control section for controlling said radio section; and
    an impedance matching subsystem for matching an impedance of said antenna with an impedance of said radio section; said impedance matching subsystem comprising different impedance values,
    wherein the different impedance values of said impedance matching subsystem are switched with a start and stop of a talking state of said telephone, and
    wherein the start and stop of said talking state of said telephone is determined by a start and stop of audio information in said radio-frequency reception signal.

2. The telephone according to claim 1, wherein said impedance matching subsystem further comprises:
    a first impedance matching circuit and a second impedance matching circuit, wherein said first and second impedance matching circuits comprise the different impedance values;
    and wherein the different impedance values of said first and second impedance matching circuits are switched by selecting one of said first or second impedance matching circuits.

3. The telephone according to claim 1, wherein said impedance matching subsystem may comprise a single impedance matching circuit having the different impedance values;

and wherein the different impedance values of said single impedance matching circuit are switched by selecting one of the impedance values of said single impedance matching circuit.

4. The telephone according to claim 1, wherein a return loss of said antenna seen from said radio section is minimized at a first frequency when said telephone is in the talking state and at a second frequency when said telephone is not in the talking state;

the first frequency being higher than the second frequency.

5. A portable telephone comprising:

an antenna;

a radio section for processing a radio-frequency reception signal received by said antenna and for processing a radio-frequency transmission signal to be transmitted and sending said radio-frequency transmission signal thus processed to said antenna;

a control section for controlling said radio section;

an impedance matching subsystem for matching an impedance of said antenna with an impedance of said radio section;said impedance matching subsystem being designed to have different impedance values; the different impedance values of said impedance matching subsystem being switched so as to be interlocked with start and stop of a talking state of said telephone; and an at least one additional antenna, wherein the different impedance values of said impedance matching subsystem are changed between said antenna and the at least one additional antenna to compensate for the influence of a human body.

6. A portable telephone comprising:

an antenna;

a radio section for processing a radio-frequency reception signal received by said antenna and for processing a radio-frequency transmission signal to be transmitted, and sending said radio-frequency transmission signal thus processed to said antenna;

a control section for controlling said radio section, wherein said control section comprises a reception signal processing circuit;

said reception signal processing circuit including an audio-frequency signal amplifier circuit for amplifying an audio-frequency signal generated by demodulating said radio-frequency reception signal; and an impedance matching subsystem for matching an impedance of said antenna with an impedance of said radio section;

said impedance matching subsystem being designed to have different impedance values, the different impedance values of said impedance matching subsystem being switched so as to be interlocked with start and stop of a talking state of said telephone;

wherein the start and stop of said talking state of said telephone is detected by detecting start and stop of operation of said audio-frequency signal amplifier circuit, thereby switching the different impedance values of said impedance matching subsystem.

7. The telephone according to claim 6, wherein the start and stop of operation of said audio-frequency signal amplifier circuit is carried out by way of a switch that controls supply of electric power to said audio-frequency signal amplifier circuit.

8. The telephone according to claim 6, wherein said impedance matching subsystem comprises impedance matching circuits having the different impedance values; and wherein the different impedance values of said impedance matching circuits are switched by selecting one of said impedance matching circuits.

9. The telephone according to claim 6, wherein said impedance matching subsystem comprises a single impedance matching circuit having the different impedance values; and wherein the different impedance values of said single impedance matching circuit are switched by selecting one of the impedance values of said single impedance matching circuit.

10. The telephone according to claim 6, wherein a return loss of said antenna seen from said radio section is minimized at a first frequency when said telephone is in the talking state and at a second frequency when said telephone is not in the talking state, the first frequency being higher than the second frequency.

11. The telephone according to claim 6, further comprising at least one additional antenna, wherein the different impedance values of said impedance matching subsystem are alternated between said antenna and the at least one additional antenna to compensate for the influence of a human body.

12. A portable telephone, comprising:

an antenna;

a radio section for processing a radio-frequency reception signal received by said antenna and for processing a radio-frequency transmission signal to be transmitted and sending said radio-frequency transmission signal thus processed to said antenna;

a control section for controlling said radio section; and an impedance matching subsystem for matching an impedance of said antenna with an impedance of said radio section;

said impedance matching subsystem being designed to have different impedance values;

the different impedance values of said impedance matching subsystem being switched so as to be interlocked with start and stop of a talking state of said telephone, wherein a first one of the different impedance values of said impedance matching subsystem is set at a value that optimizes impedance matching between said antenna and said radio section without taking an influence of a human body into consideration;

the first one of the different impedance values being selected when said telephone is not in the talking state; and wherein a second one of the different impedance values of said impedance matching subsystem is set at a value that optimizes impedance matching between said antenna and said radio section with taking an influence of a human body into consideration;

the second one of the different impedance values being selected when said telephone is in the talking state.

13. The telephone according to claim 12, wherein said impedance matching subsystem comprises impedance matching circuits having the different impedance values, and wherein the different impedance values of said impedance matching circuits are switched by selecting one of said impedance matching circuits.

14. The telephone according to claim 12, wherein said impedance matching subsystem comprises a single impedance matching circuit having the different impedance values; and wherein the different impedance values of said single impedance matching circuit are switched by selecting one of the impedance values of said single impedance matching circuit.

15. The telephone according to claim 12, wherein a return loss of said antenna seen from said radio section is minimized at a first frequency when said telephone is in the talking state and at a second frequency when said telephone is not in the talking state, the first frequency being higher than the second frequency.

16. A portable telephone, comprising:

an antenna;

a radio section for processing a radio-frequency reception signal received by said antenna and for processing a radio-frequency transmission signal to be transmitted and sending said radio-frequency transmission signal thus processed to said antenna;

a control section for controlling said radio section; and an impedance matching subsystem for matching an impedance of said antenna with an impedance of said radio section;

said impedance matching subsystem being designed to have different impedance values;

the different impedance values of said impedance matching subsystem being switched so as to be interlocked with start and stop of a talking state of said telephone, wherein a return loss of said antenna seen from said radio section is minimized at a first frequency when said telephone is in the talking state and at a second frequency when said telephone is not in the talking state;

the first frequency being higher than the second frequency; and wherein the first frequency is changed to a frequency equal or near the second frequency due to the influence of a human body.

17. The telephone according to claim 16, wherein said impedance matching subsystem comprises impedance matching circuits having the different impedance values, and wherein the different impedance values of said impedance matching circuits are switched by selecting one of said impedance matching circuits.

18. The telephone according to claim 16, wherein said impedance matching subsystem comprises a single impedance matching circuit having the different impedance values, and wherein the different impedance values of said single impedance matching circuit are switched by selecting one of the impedance values of said single impedance matching circuit.

19. A portable telephone comprising:

a radio section comprising a reception signal processing circuit, wherein said reception signal processing circuit includes an audio-frequency signal amplifier circuit for amplifying an audio-frequency signal generated by demodulating a radio-frequency reception signal; and an impedance matching subsystem for matching an impedance of said antenna with an impedance of said radio section, said impedance matching subsystem being designed to have different impedance values, wherein the different impedance values of said impedance matching subsystem are changed according to the start and stop of a talking state of said telephone, and wherein the start and stop of said talking state of said telephone is detected by detecting start and stop of operation of said audio-frequency signal amplifier circuit, thereby switching the different impedance values of said impedance matching subsystem.

20. The telephone according to claim 19, wherein said impedance matching subsystem comprises impedance matching circuits having the different impedance values, and wherein the different impedance values of said impedance matching circuits are switched by selecting one of said impedance matching circuits.

* * * * *